(12) United States Patent
Davidsson et al.

(10) Patent No.: US 8,994,490 B2
(45) Date of Patent: Mar. 31, 2015

(54) CHIP RESISTOR WITH OUTRIGGER HEAT SINK

(71) Applicant: Smiths Interconnect Microwave Components, Inc., Stuart, FL (US)

(72) Inventors: Paul Davidsson, Stuart, FL (US); Robert Blacka, Port St. Lucie, FL (US); Kai Loh, Port St. Lucie, FL (US)

(73) Assignee: Smiths Interconnect Microwave Components, Inc., Stuart, FL (US)

( * ) Notice: Subject to any disclaimer, the term of this patent is extended or adjusted under 35 U.S.C. 154(b) by 85 days.

(21) Appl. No.: 14/015,914

(22) Filed: Aug. 30, 2013

(65) Prior Publication Data

US 2014/0060897 A1    Mar. 6, 2014

Related U.S. Application Data

(60) Provisional application No. 61/695,193, filed on Aug. 30, 2012.

(51) Int. Cl.
| | | |
|---|---|---|
| *H01C 7/10* | (2006.01) | |
| *H01C 7/13* | (2006.01) | |
| *H05K 7/20* | (2006.01) | |
| *H01C 1/01* | (2006.01) | |
| *H04B 1/00* | (2006.01) | |
| *H05K 1/02* | (2006.01) | |

(52) U.S. Cl.
CPC .............. *H05K 7/2039* (2013.01); *H01C 1/01* (2013.01); *H04B 1/00* (2013.01); *H05K 1/0203* (2013.01); *H05K 1/0204* (2013.01); *H05K 1/0219* (2013.01); *H05K 1/0243* (2013.01); *H05K 2201/09236* (2013.01); *H05K 2201/10022* (2013.01)

USPC ........................................................ 338/22 R

(58) Field of Classification Search
CPC ...... H01C 17/006; H01C 7/003; H01C 1/084; H01C 17/22; H01C 17/281; H01C 1/01; H01C 1/08; H01C 1/148; H01C 3/12; H01C 7/00; H01C 7/18; H05K 1/0203; H05K 2201/10022; H05K 2201/10674; H05K 1/0204; H05K 1/167; H05K 2201/068; H05K 2201/10636
USPC ................................ 338/22 R, 50, 51, 57, 58
See application file for complete search history.

(56) References Cited

U.S. PATENT DOCUMENTS

| | | | |
|---|---|---|---|
| 5,179,366 A | | 1/1993 | Wagner |
| 5,841,340 A | * | 11/1998 | Passaro et al. ............... 338/51 |
| 5,945,905 A | * | 8/1999 | Mazzochette ............... 338/51 |
| 7,190,252 B2 | * | 3/2007 | Smith et al. ................. 338/309 |
| 8,043,106 B1 | | 10/2011 | Morello et al. |

(Continued)

FOREIGN PATENT DOCUMENTS

| | | |
|---|---|---|
| JP | 08-222401 | 8/1996 |
| KR | 10-2009-0105058 | 10/2009 |
| KR | 10-20110073765 | 6/2011 |

*Primary Examiner* — Kyung Lee
(74) *Attorney, Agent, or Firm* — Snell & Wilmer LLP

(57) ABSTRACT

A surface mount chip resistor for increasing power handling capabilities of radio frequency (RF) circuits and for minimizing parasitic capacitance and inductance effects, the chip resistor includes a ceramic substrate having a main portion and an outrigger. A resistor element is between an input contact and an output contact on a top surface of the main portion. A ground plane attachment area is on a top surface of the outrigger. The ground plane attachment area is mounted to a ground plane of a circuit board to provide a heat pathway for dissipating heat generated by the resistor element.

20 Claims, 8 Drawing Sheets

(56) References Cited

U.S. PATENT DOCUMENTS 8,823,483 B2 * 9/2014 Smith et al. .................. 338/332
2004/0198100 A1 10/2004 Fink et al.
2010/0328021 A1 12/2010 Hirasawa et al.
2011/0156860 A1 6/2011 Smith et al.

* cited by examiner

| POWER (WATTS) | RESISTANCE (Ohms) | CHIP TEMPERATURE (°C) | TIME (MINUTES) |
| --- | --- | --- | --- |
| 0.00 | 267.32 | 28.0 | 20.0 |
| 0.10 | 267.32 | 40.2 | 20.0 |
| 0.20 | 267.32 | 43.7 | 20.0 |
| 0.30 | 267.32 | 47.7 | 20.0 |
| 0.40 | 267.33 | 50.8 | 20.0 |
| 0.50 | 267.33 | 57.7 | 20.0 |
| 0.60 | 267.33 | 60.5 | 20.0 |
| 0.70 | 267.33 | 64.1 | 20.0 |
| 0.80 | 267.33 | 67.2 | 20.0 |
| 0.90 | 267.33 | 71.2 | 20.0 |
| 1.00 | 267.33 | 75.1 | 20.0 |

TYPICAL SPECIFICATIONS

700

| | |
|---|---|
| FREQUENCY: | DC TO 6.0 GHz, USEABLE TO 20 GHz |
| DC RESISTANCE: | 1.0 Ω TO 1M Ω |
| POWER, AVERAGE: | 500 mW |
| TCR OF RESISTOR: | +/- 200 ppm/°C MAXIMUM |
| TEMPERATURE, OPERATING: | -55°C TO +150°C |
| TEMPERATURE, STORAGE: | -55°C TO +175°C |
| RESISTOR COMPOSITION: | THICK FILM |
| TERMINALS COMPOSITION: | PLATINUM/GOLD, SOLDERABLE |

FIG. 7

BILL OF MATERIALS:

800

| PART | DESCRIPTION | NOTES |
|---|---|---|
| SUBSTRATE | SUBSTRATE, ALUMINA, 96% | 3x3, 15 mil THICK |
| CONTACT | CONDUCTOR INK, FERRO C4270 | PLATINUM/GOLD |
| RESISTOR | RESISTOR INK, DUPONT, 50 Ω/☐ | FOR 131 Ω RESISTOR |
| RESISTOR | RESISTOR INK,T DUPONT, 100 Ω/☐ | FOR 262 Ω RESISTOR |
| COATING | PROTECTIVE COATING, FERRO, BLUE | P/N ERP6283C |

FIG. 8

CHIP RESISTOR WITH OUTRIGGER HEAT SINK

CROSS-REFERENCE TO RELATED APPLICATION(S)

This application claims the benefit of U.S. Provisional Application No. 61/695,193, filed on Aug. 30, 2012, which is hereby incorporated by reference in its entirety.

BACKGROUND

1. Field

The present disclosure describes chip resistors and other resistive devices with improved power handling capability while maintaining low capacitance essential for circuits to operate efficiently in the microwave region of the radio frequency (RF) spectrum.

2. Description of the Related Art

Chip resistors are a common element in RF and Microwave circuits. The various uses for chip resistors generally include one or more of the following: change the amplitude of an RF signal, limit the current in an RF transmission line, or alter the impedance of the transmission line.

As circuit board sizes decrease, designers are faced with the challenge of fitting or positioning more and more circuitry into smaller spaces. Also, as frequencies increase, designers are trending toward smaller and smaller components to minimize parasitic affects which are detrimental to the functioning of circuits. However, decreasing board sizes and smaller components present challenges to heat dissipation in order to prevent premature failure.

Physically small devices tend to have better performance in the microwave region of the RF spectrum because they constitute a small fraction of a wavelength at the frequencies of interest. This reduces detrimental parasitic effects due to excessive inductance and capacitance. As the size of the component decreases, the power handling capability also decreases.

Heat dissipation can be improved by using advanced materials having good thermal conductivity, such as Diamond, Beryllium Oxide, or Aluminum Nitride. Because these materials are either very expensive or toxic, they fail to provide a viable commercial solution. In addition, when using a higher thermally conductive material, the heat generated in a conventional surface mount chip resistor is dissipated through the circuit traces or through the air, which fail to provide satisfactory thermal paths.

Therefore, there exists a need for a chip resistor that combines small physical size, high power handling capability, low capacitance, and low cost. For example, a typical, commercially available, surface mount resistor, in the 0402 size, measures 0.040×0.020 inches (1.0×0.5 mm) and has a power rating of about 0.063 watts. This is insufficient for many applications. If higher power is forced through the surface mount resistor, it will heat to the point that the solder connections will melt leading to a catastrophic failure of the circuit.

Using a physically larger surface mount resistor with a higher power rating can overcome these drawbacks. However, because current design trends favor smaller circuit boards, circuit boards may lack the physical space for the inclusion of a larger surface mount resistor. Even if sufficient space was available, a larger surface mount resistor will have more capacitance and/or inductance, requiring more elaborate tuning measures to minimize these effects. Circuitry necessary to tune out these parasitics takes up valuable board space and reduces the bandwidth of the circuit, an unsatisfactory side effect. In addition, many boards are already designed for optimal RF performance and the dimensions of the circuit traces cannot be changed without a substantial performance, financial, and delivery impact. Designers must use the layout as it is already manufactured.

There is a need for a chip resistor which matches the current industry-standard pad size and configuration, which drastically improves the power handling capability, and at the same time, maintains the low capacitance essential for circuits to operate efficiently in the microwave region of the RF spectrum.

SUMMARY

The present disclosure relates to a chip resistor with an extended portion or outrigger attached to a main portion of a substrate. The outrigger provides a heat pathway to a ground plane of a circuit board to dissipate heat generated by the chip resistor.

In one implementation, the chip resistor includes a substrate having a main portion with a top surface and a first extended portion with a top surface. First and second contacts are mounted on the top surface of the main portion, and a resistor element is mounted on the top surface of the main portion between the first and second contacts. A first conductor is positioned on the top surface of the first extended portion, spaced apart from the resistor element, and configured for mounting to a ground plane of a circuit board for dissipating heat generated by the resistor element.

In another implementation, a surface mount chip resistor includes a ceramic substrate having a main portion, and first and second extended portions, with the main portion located between the first and second extended portions. An input contact and an output contact are mounted on the top surface of the main portion. A resistor element is mounted on the top surface of the main portion between the input and output contacts. A first conductor is spaced apart from the resistor element and positioned on the top surface of the first extended portion. A second conductor is spaced apart from the resistor element and positioned on the top surface of the second extended portion. The first and second conductors are configured for mounting to a ground plane of a circuit board to provide two pathways to dissipate heat generated by the resistor element.

BRIEF DESCRIPTION OF THE DRAWINGS

The features, obstacles, and advantages of the present application will become more apparent from the detailed description set forth below when taken in conjunction with the drawings, wherein:

FIG. 7 is a table of specifications according to an implementation of the present disclosure; and FIG. 8 is a table of materials according to an implementation of the present disclosure.

DETAILED DESCRIPTION

Apparatus, systems and methods that implement the implementations of the various features of the present application will now be described with reference to the drawings. The drawings and the associated descriptions are provided to illustrate some implementations of the present application and not to limit the scope of the present application. Throughout the drawings, reference numbers are re-used to indicate correspondence between referenced elements.

In the following detailed description, numerous specific details are set forth to provide an understanding of the present invention. It will be apparent, however, to one ordinarily skilled in the art that elements of the present invention may be practiced without some of these specific details. In other instances, well-known structures and techniques have not been shown in detail to avoid unnecessarily obscuring the present invention.

The drawings show a chip resistor which has an industry-standard footprint but with improved power handling capability while maintaining very low capacitance and inductance. As described above, a typical, commercially available, surface mount resistor in the 0402 size has a power rating of about 0.063 watts. The chip resistor described herein has a power rating of 1 watt, more than 15 times greater than currently available products, while maintaining the same footprint and low capacitance and inductance. Although the 0402 size is used here as an example, the concept is scalable to larger and smaller size chips. In addition, the frequencies discussed by the present disclosure range from about 100 KHz to 60 GHz or any portion thereof. However, in other implementations, other frequencies may be utilized.

Figure 1:
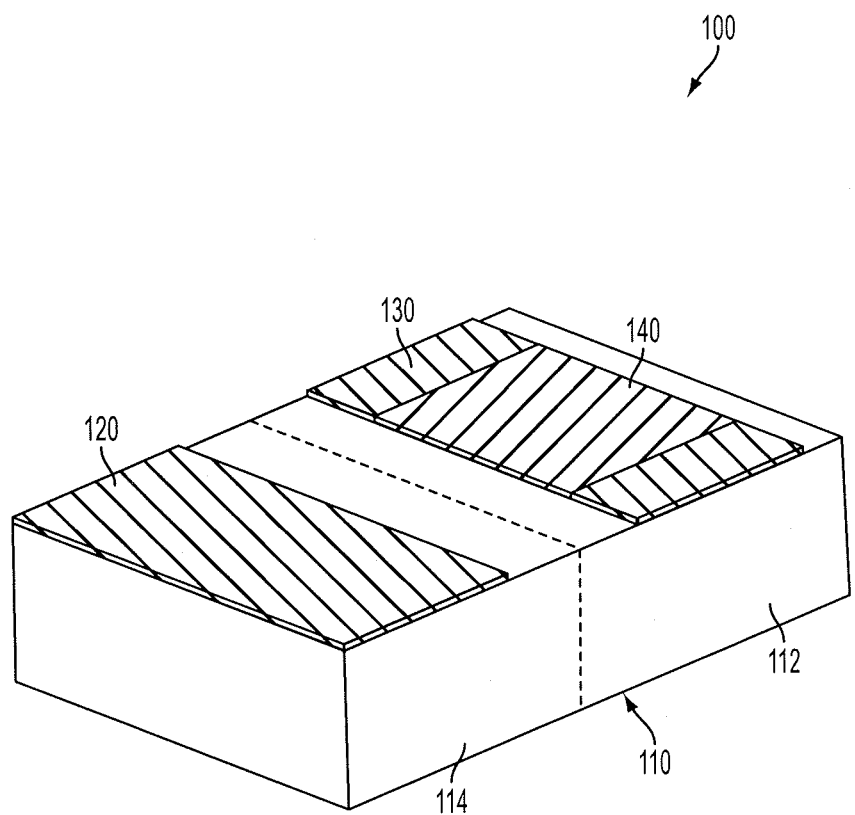
FIG. 1 is an isometric view of a surface mount chip resistor according to an implementation of the present disclosure.

FIG. 1 presents a chip resistor 100 according to an implementation of the present disclosure. The chip resistor 100 includes a substrate 110. A resistor element 140 and two contacts 130 lie on a top surface of a main portion 112 of the substrate 110. A ground plane attachment area 120 lies on a top surface of an extended portion 114 of the substrate 110. The substrate 110 may be made of a ceramic material.

The resistor element 140, the contacts 130, and the ground plane attachment area 120 may be screen printed or otherwise deposited onto the substrate 110. For example, the resistor element 140 may be formed using a resistive ink or a conductive ink in screen and stencil printing processes, sometimes referred to as "thick film" resistors, which generally have a thickness between about 200 micro-inches to about 1000 micro-inches. Alternatively, the resistor element 140 can be formed using sputtering, evaporation or other vacuum deposition processes of a resistive material and etched, sometimes referred to as "thin film" resistors, which generally have a thickness between about 300 Angstroms to 25,500 Angstroms (1.2 micro-inches to 100.4 micro-inches).

The chip resistor 100 exhibits improved thermal performance by utilizing ground plane material that is already available on a printed circuit board (PCB). Ground planes are generally made of copper, which is an excellent heat conductor. Ground planes are also highly solderable which facilitates attachment of components. The ground plane material provides for the correct functioning of microwave circuits and is necessary for optimal circuit operation, but is generally unused to attach other components.

The chip resistor 100 incorporates the addition of an extended piece of ceramic material, the extended portion 114, attached to the resistor substrate, the main portion 112, which is then soldered down to the existing ground plane on the circuit board. Heat is drawn away from the resistor element 140, where the heat is generated, and dissipating it safely into the surrounding metal ground plane. The chip resistor 100 has one "outrigger," or extra piece of ceramic material (i.e. the extended portion 114) attached for applications having only one available ground plane. As will be discussed below, other implementations may have more outriggers.

With respect to RF performance, the additional piece of ceramic, the extended portion 114, has minimal or no effect on the response of the circuit, thus retuning is not necessary. Adding the additional piece of ceramic adds almost no cost to the manufacturing of the chip resistor 100, but results in considerably higher performance, mechanically, thermally, and electrically.

Figure 2A:
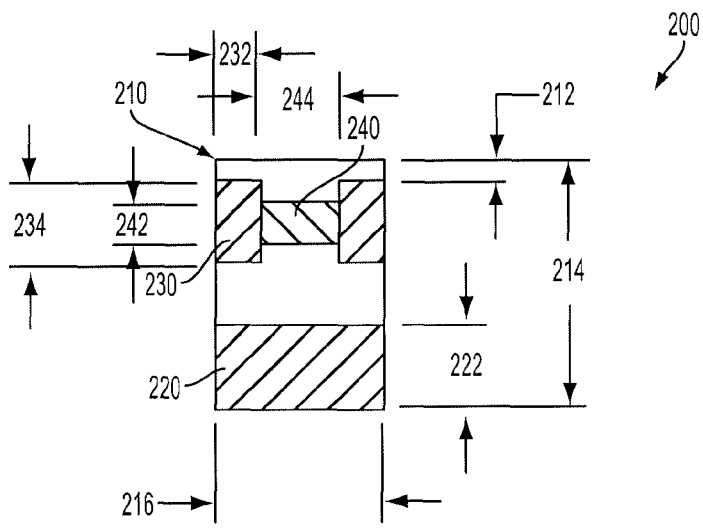
FIG. 2A is a top view of a chip resistor according to an implementation of the present disclosure.
Figure 2B:
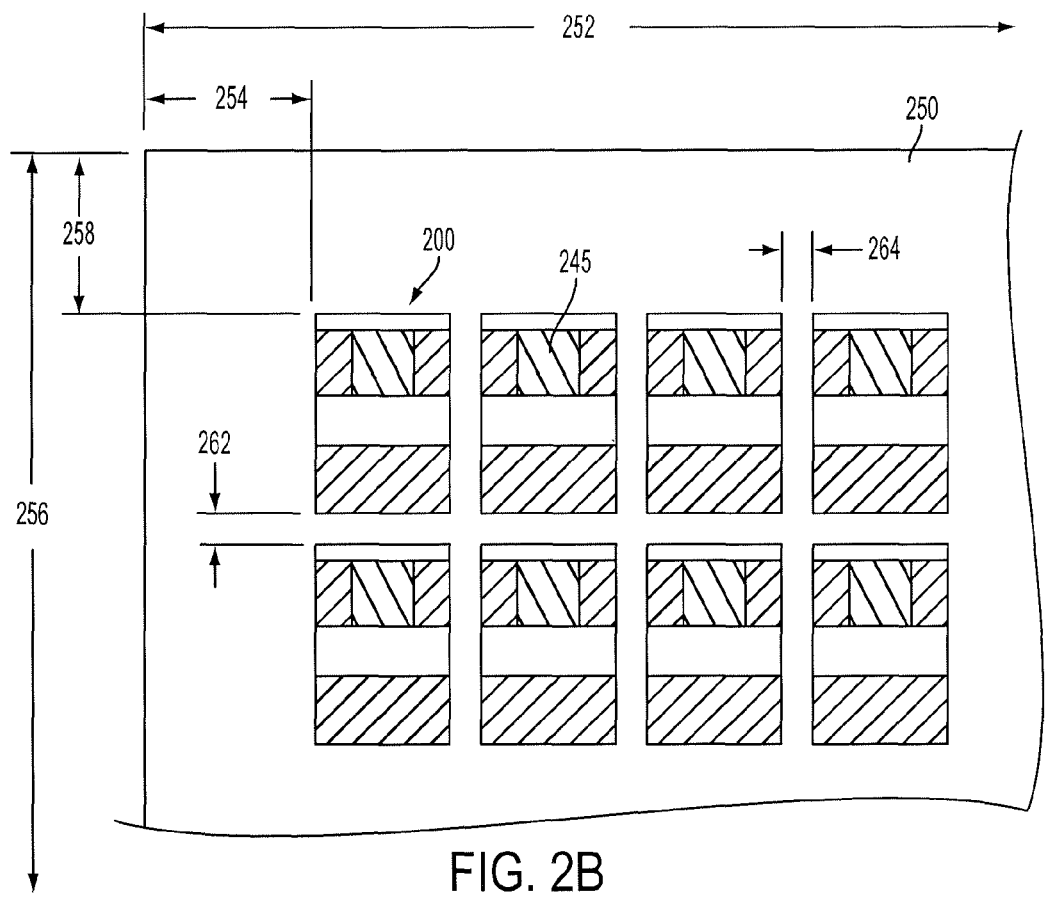
FIG. 2B is a top view of an array of chip resistors according to an implementation of the present disclosure.

FIGS. 2A and 2B illustrate exemplary dimensions for manufacturing chip resistors similar to the chip resistor 100. However, in alternative implementations the dimensions and thicknesses may vary based on the application. A chip resistor 200 in FIG. 2A may be similar to the chip resistor 100. The chip resistor 200 has contacts 230, a resistor element 240, and a ground plane attachment area 220 over a substrate 210.

The substrate 210 has a width 216, which may be about 0.040 inches, and a height 214, which may be about 0.060 inches. Each contact 230 has a width 232, which may be about 0.010 inches, and a height 234, which may be about 0.020 inches. Each contact 230 is a distance 212, which may be about 0.005 inches, offset from an edge of the substrate 210, while aligned against side edges of the substrate 210, as seen in FIG. 2A. The resistor element 240 is between and touches the contacts 230. The resistor element 240 has a height 242, which may be about 0.010 inches, and a width 244, which may be about 0.020 inches. Note that the widths 232 and 244 approximately equal the width 216. The ground plane attachment area 220 also has the width 216. The ground plane attachment area 220 also has a height 222, which may be about 0.020 inches.

FIG. 2B depicts a wafer 250 having an array of chip resistors 200. The wafer 250 has a width 252, which may be about 3.000 inches, and a height 256, which may be about 3.000 inches. In FIG. 2B, the wafer 250 is a 3 inch square wafer, but in other implementations the dimensions may vary as needed.

The wafer 250 may hold an array of 40×30 chip resistors 200, although in other implementations the size of the array may vary. The array is offset a distance 254, which may be about 0.505 inches, from a side edge of the wafer 250, and offset a distance 258, which may be about 0.455 inches, from a top edge of the wafer 250, as seen in FIG. 2B.

The chip resistors 200 further include a protective coating 245 covering the resistor element 240. The protective coating 245 shares the width 244 of the resistor element 240, and the height 234 of the contacts 230. Within the array, each chip resistor 200 is spaced a distance 264, which may be about 0.010 inches, from neighboring chip resistors 200 in the same row, and spaced a distance 262, which may be about 0.010 inches, from adjacent rows. Thus, multiple chip resistors 200 may be fabricated on a single wafer 250.

Figure 3A:
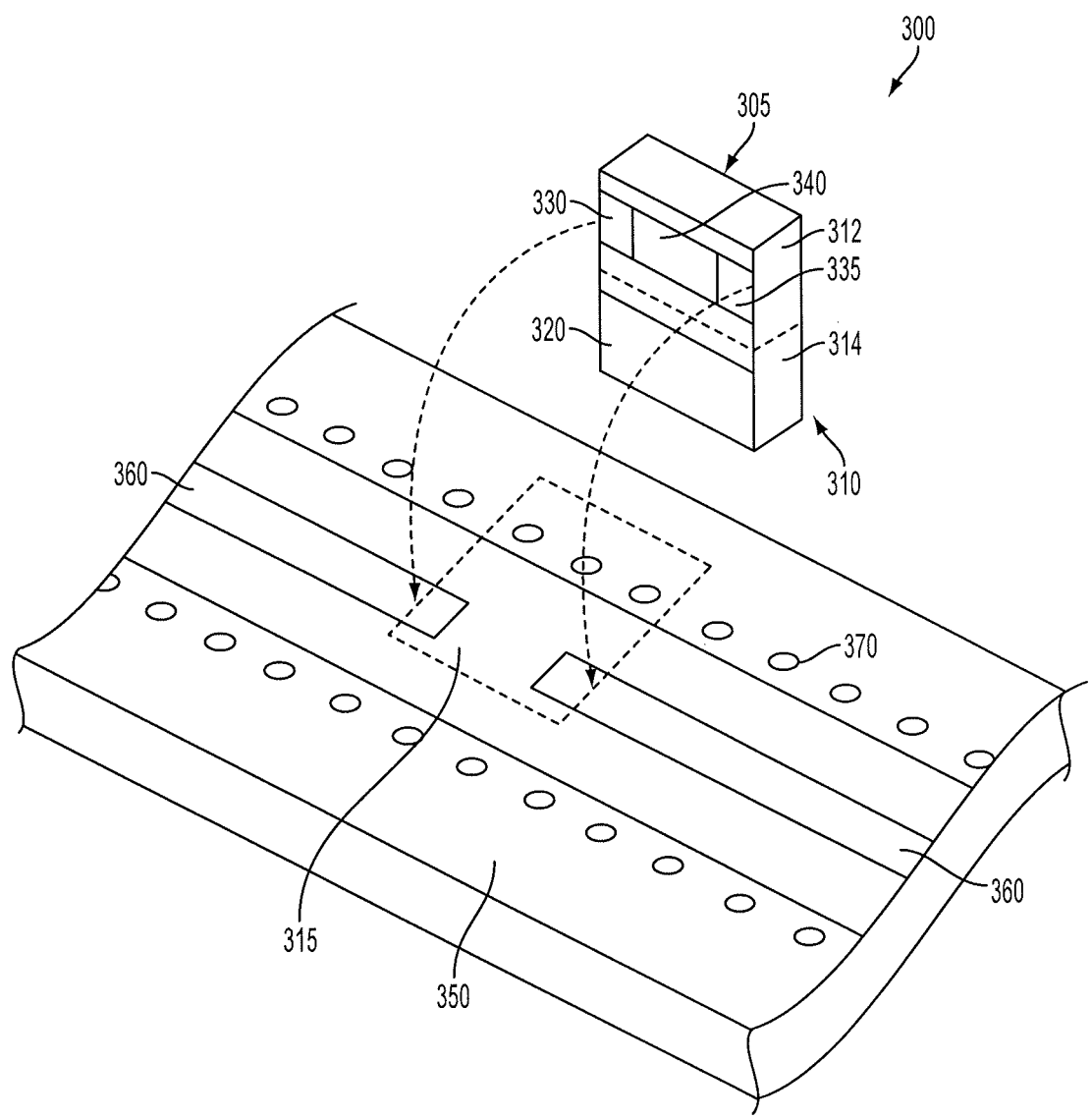
FIG. 3A is a chip resistor with a single outrigger prior to assembly according to an implementation of the present disclosure.

FIG. 3A depicts a pre-assembled state 300 of a chip resistor 305. The chip resistor 305 may be similar to the chip resistors 100 and 200. The chip resistor 305 includes a substrate 310 which includes a main portion 312 and an outrigger 314, a ground plane attachment area 320, an input contact 330, an output contact 335, and a resistor element 340. The chip resistor 305 is configured to attach to a coplanar wave guide structure 350.

Figure 3B:
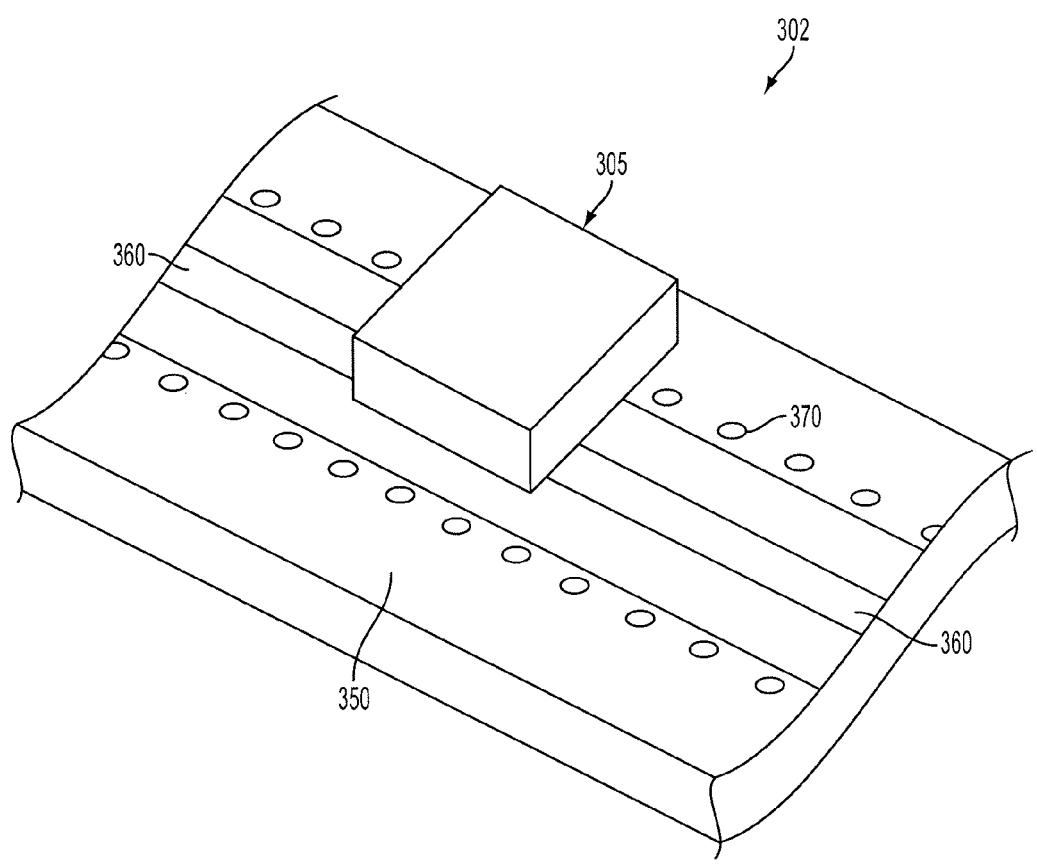
FIG. 3B is a chip resistor with a single outrigger after assembly according to an implementation of the present disclosure.

The coplanar wave guide structure 350 includes RF traces 360, and via holes 370, which connect to a bottom ground plane not seen in FIG. 3A. A heat sink area 315 corresponds to an attachment area for the chip resistor 305. As seen in FIG. 3A, when the chip resistor 305 is attached to the heat sink area 315, the input contact 330 aligns with and contacts the RF trace 360, and the output contact 335 aligns with and contacts the other RF trace 360. The ground plane attachment area 320 aligns with and contacts several via holes 370 for connection to the ground plane. An assembled state 302 is depicted in FIG. 3B.

Another implementation may incorporate two outriggers, rather than one. With two outriggers, the resistor element is mounted centrally between two thermal paths to the ground plane. Two outriggers advantageously doubles the power handling capability of the chip resistor and works particularly well for RF circuits using Coplanar Ground Planes (CPWs), where there is copper material already available on both sides of the RF transmission line, resulting in a very efficient heat sink.

Figure 4A:
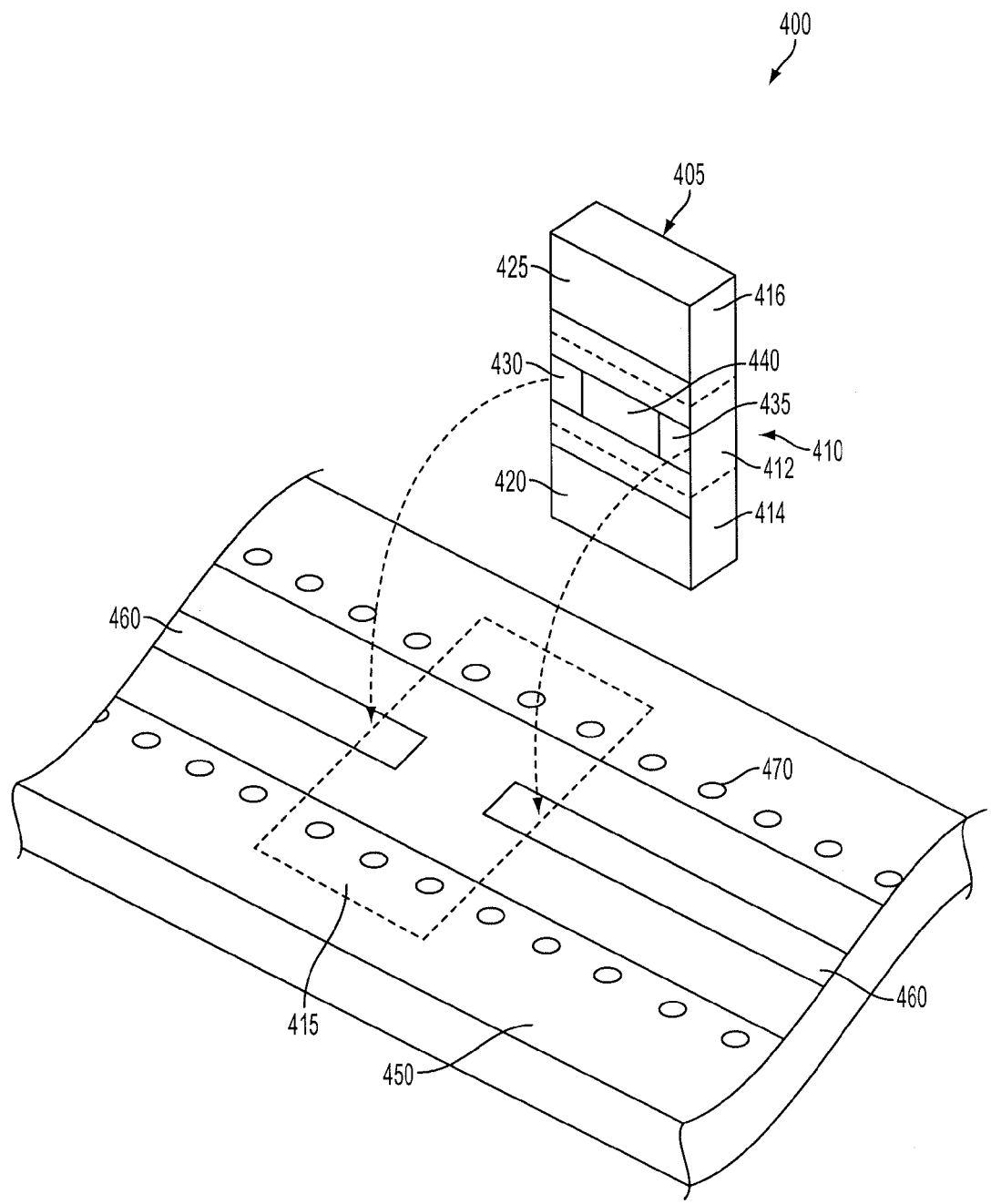
FIG. 4A is a chip resistor with double outriggers prior to assembly according to an implementation of the present disclosure.
Figure 4B:
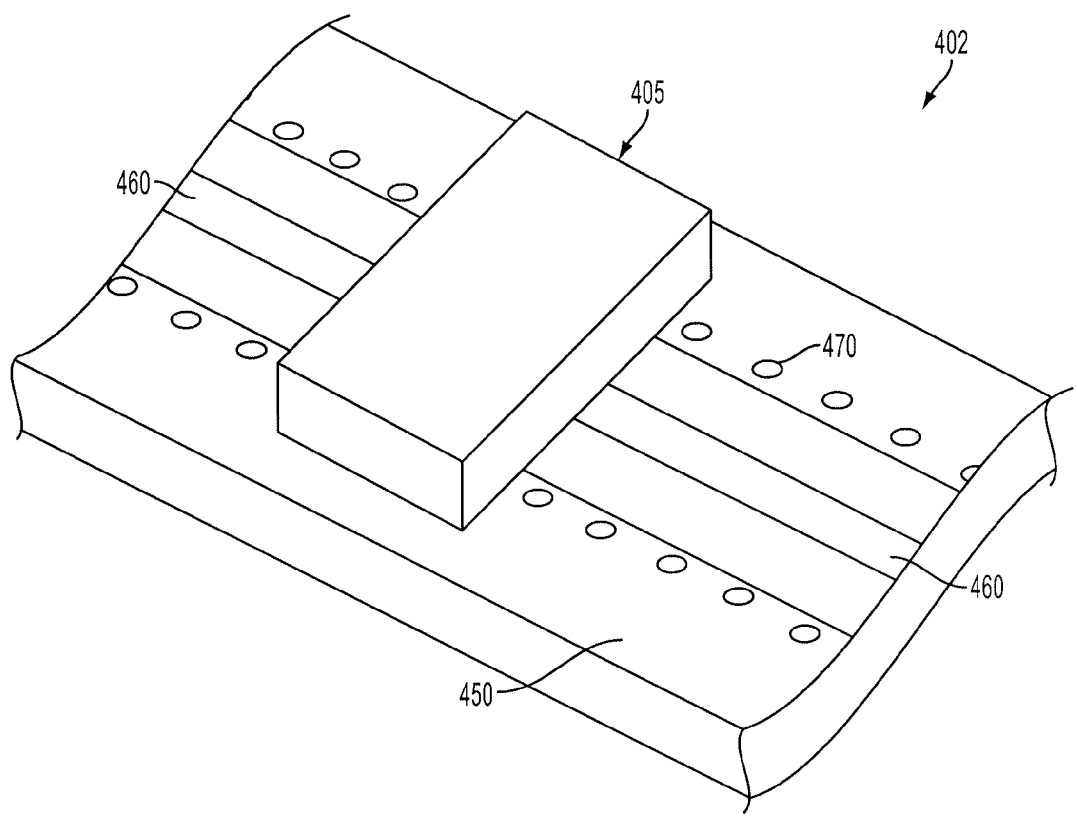
FIG. 4B is a chip resistor with double outriggers after assembly according to an implementation of the present disclosure.

FIGS. 4A and 4B show a double outrigger arrangement according to an implementation of the present disclosure. FIG. 4A illustrates a pre-assembled state 400 of a chip resistor 405. The chip resistor 405 includes a substrate 410 which includes a main portion 412. The chip resistor 405 also includes an input contact 430, an output contact 435, and a resistor element 440. Unlike the chip resistors 100, 200, or 305, the chip resistor 405 includes a first extended portion or outrigger 414 and a second extended portion or outrigger 416. Accordingly, the chip resistor 405 further includes a first ground plane attachment area 420 over the first extended portion 414 and a second ground plane attachment area 425 over the second extended portion 416.

The chip resistor 405 is configured to attach to a coplanar wave guide structure 450, which may be similar to the coplanar wave guide structure 350. The coplanar wave guide structure 450 includes RF traces 460, and via holes 470, which may connect to a bottom ground plane not seen in FIG. 4A. A heat sink area 415 corresponds to an attachment area for the chip resistor 405. As compared to the heat sink area 315 in FIG. 3A, the heat sink area 415 is larger, encompassing two rows of via holes 470 rather than just one.

As seen in FIG. 4A when the chip resistor 405 is attached to the heat sink area 415, the input contact 430 aligns with and contacts the RF trace 460, and the output contact 435 aligns with and contacts the other RF trace 460. The ground plane attachment area 420 aligns with and contacts a first row of via holes 470 for connection to the ground plane. The ground plane attachment area 425 aligns with and contacts a second row of via holes 470 for connection to the ground plane. An assembled state 402 is depicted in FIG. 4B.

Figures 5, 6:
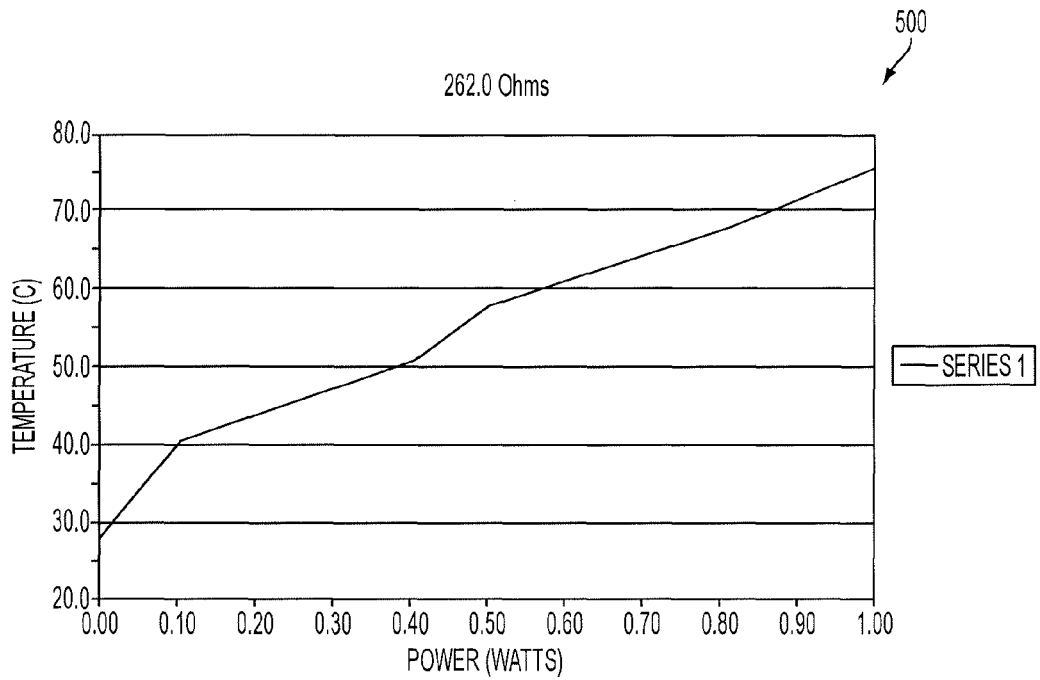
FIG. 5 is a graph of performance data according to an implementation of the present disclosure.
FIG. 6 is a table of performance data according to an implementation of the present disclosure.

FIG. 5 shows a graph 500 of performance results of a chip resistor, such as the chip resistor 100, 200, 305, or 405, listed in table 600 of FIG. 6. As the chip resistor handles more power, the temperature rises. As seen in FIGS. 5 and 6, the chip resistor of the present disclosure reaches a temperature of about 75.1 degrees C. at 1 watt, which generally outperforms conventional chip resistors.

FIG. 7 presents a table 700 of typical specifications of a chip resistor according to an implementation of the present disclosure.

FIG. 8 presents a table 800 of exemplary materials for fabricating the chip resistor 200, although in other implementations other suitable materials may be used. The substrate 210 may be made of alumina 96%, 15 mil thick. The contacts 230 may be made of conductor ink Ferro C4270 made of platinum/gold. The resistor element 240 may be made of DuPont resistor ink at 50 ohms/square for a 131 ohm resistor, or DuPont resistor ink at 100 ohms/square for a 262 ohm resistor. The protective coating 245 may be made of Ferro blue protective coating.

The previous description of the disclosed examples is provided to enable any person of ordinary skill in the art to make or use the disclosed methods and apparatus. Various modifications to these examples will be readily apparent to those skilled in the art, and the principles defined herein may be applied to other examples without departing from the spirit or scope of the disclosed method and apparatus. The described implementations are to be considered in all respects only as illustrative and not restrictive and the scope of the application is, therefore, indicated by the appended claims rather than by the foregoing description. All changes which come within the meaning and range of equivalency of the claims are to be embraced within their scope.

What is claimed is:

1. A surface mount chip resistor comprising:
   a substrate having a main portion with a top surface and a first extended portion with a top surface;
   a first contact mounted on the top surface of the main portion;
   a second contact mounted on the top surface of the main portion;
   a resistor element mounted on the top surface of the main portion between the first and second contacts; and
   a first conductor spaced apart from the resistor element and positioned on the top surface of the first extended portion for mounting to a ground plane of a circuit board and for dissipating heat generated by the resistor element.

2. The surface mount chip resistor of claim 1 wherein the resistor element is foamed from a resistive ink.

3. The surface mount chip resistor of claim 2 wherein the first and second contacts are formed from a conductive ink.

4. The surface mount chip resistor of claim 3 wherein the thickness of each of the resistor element and the first and second contacts is from about 200 micro-inches to about 1000 micro-inches.

5. The surface mount chip resistor of claim 3 wherein the resistor element and the first and second contacts are formed with vacuum deposition processes.

6. The surface mount chip resistor of claim 3 wherein the resistor element is made of a resistive material selected from a group consisting of a Tantalum Nitride, a Nichrome and combinations thereof.

7. The surface mount chip resistor of claim 3 wherein the first and second contacts are made of a conductive material selected from a group consisting of Gold, Platinum, Nickel, Palladium, Titanium, Tungsten, Copper, and combinations thereof.

8. The surface mount chip resistor of claim 5 wherein the thickness of each of the resistor element and the input and output contacts is from about 300 Angstroms to 25,500 Angstroms (1.2 micro-inches to 100.4 micro-inches).

9. The surface mount chip resistor of claim 1 further comprising a protective coating covering the resistor element.

10. The surface mount chip resistor of claim 1 wherein the substrate has a second extended portion with a top surface, wherein the main portion is located between the first extended portion and the second extended portion.

11. The surface mount chip resistor of claim 10 further comprising a second conductor spaced apart from the resistor element and positioned on the top surface of the second extended portion for mounting to the ground plane of the circuit board and for dissipating heat generated by the resistor element.

12. The surface mount chip resistor of claim 1 wherein a length, a width and a height of the main portion is substantially the same as a length, a width and a height, respectively, of the first extended portion.

13. The surface mount chip resistor of claim 1 wherein the first extended portion includes only the substrate and the first conductor.

14. A surface mount chip resistor for increasing the power handling capabilities of radio frequency (RF) circuits and for minimizing parasitic capacitance and inductance effects, the surface mount chip resistor comprising:
- a ceramic substrate having a main portion with a top surface and a first extended portion with a top surface;
- an input contact mounted on the top surface of the main portion;
- an output contact mounted on the top surface of the main portion;
- a resistor element mounted on the top surface of the main portion between the input contact and the output contact; and
- a first conductor spaced apart from the resistor element and positioned on the top surface of the first extended portion for mounting to a ground plane of a circuit board and for dissipating heat generated by the resistor element.

15. The surface mount chip resistor of claim 14 wherein the resistor element is formed from a resistive ink and the input and output contacts are formed from a conductive ink.

16. The surface mount chip resistor of claim 1 further comprising a protective coating covering the resistor element.

17. The surface mount chip resistor of claim 1 wherein a length, a width and a height of the main portion is substantially the same as a length, a width and a height, respectively, of the first extended portion.

18. A surface mount chip resistor for increasing the power handling capabilities of radio frequency (RF) circuits and for minimizing parasitic capacitance and inductance effects, the surface mount chip resistor comprising:
- a ceramic substrate having a main portion with a top surface, a first extended portion with a top surface, and a second extended portion with a top surface, the main portion located between the first and second extended portions;
- an input contact mounted on the top surface of the main portion;
- an output contact mounted on the top surface of the main portion;
- a resistor element mounted on the top surface of the main portion between the input contact and the output contact;
- a first conductor spaced apart from the resistor element and positioned on the top surface of the first extended portion for mounting to a ground plane of a circuit board and for dissipating heat generated by the resistor element; and
- a second conductor spaced apart from the resistor element and positioned on the top surface of the second extended portion for mounting to the ground plane of the circuit board and for dissipating heat generated by the resistor element.

19. The surface mount chip resistor of claim 1 further comprising a protective coating covering the resistor element.

20. The surface mount chip resistor of claim 1 wherein a length, a width and a height of the main portion is substantially the same as a length, a width and a height, respectively, of the first extended portion and a length, a width, and a height, respectively, of the second extended portion.

* * * * *